(12) United States Patent
Merritt et al.

(10) Patent No.: US 6,490,220 B1
(45) Date of Patent: Dec. 3, 2002

(54) METHOD FOR RELIABLY SHUTTING OFF OSCILLATOR PULSES TO A CHARGE-PUMP

(75) Inventors: Todd A. Merritt, Boise, ID (US); Shubneesh Batra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/927,373

(22) Filed: Aug. 13, 2001

(51) Int. Cl.[7] ................................................ G11C 7/00
(52) U.S. Cl. .................. 365/226; 365/227; 365/189.09; 365/191; 365/194; 327/536; 327/390; 327/589; 307/110
(58) Field of Search ................................ 365/226, 227, 365/189.09, 191, 194; 327/536, 390, 589; 307/110

(56) References Cited

U.S. PATENT DOCUMENTS 6,285,225 B1 * 3/2002 Banba et al. ............... 365/226

2001/0017565 A1 * 8/2001 Zanuccoli et al. .......... 327/536
2001/0026187 A1 * 10/2001 Oku ........................... 327/536

* cited by examiner

Primary Examiner—Richard Elms
Assistant Examiner—Toan Le
(74) Attorney, Agent, or Firm—Dickstein Shapiro Morin & Oshinsky LLP (57) ABSTRACT

A multiple core charge pump includes a plurality of switches disposed between the taps of a delay chain and the individual charge pump cores. When the switches are closed, an oscillating clock signal is permitted to propagate through the delay chain and reach individual charge pump cores via the taps. A regulator senses the output voltage of the charge pump. When the output node reaches the desired voltage, the regulator simultaneously causes each of the switches to open, decoupling each of the charge pump cores from the taps of the delay chain, and preventing signals which are still propagating through the delay chain from triggering the charge pump cores. A transition detector may also be used to narrow the pulse width of the oscillating clock signal which is applied to each switch.

31 Claims, 7 Drawing Sheets

METHOD FOR RELIABLY SHUTTING OFF OSCILLATOR PULSES TO A CHARGE-PUMP

FIELD OF INVENTION

The present invention relates to a charge pump for generating a larger magnitude output voltage from an input voltage, and more particularly, to a method and apparatus for accurately controlling the boosted voltage generated by a charge pump having multiple cores.

BACKGROUND OF THE INVENTION

Many electronic devices require a plurality of operating voltages. For example, dynamic random access memory (DRAM) devices require a standard operating voltage and an increased voltage. The increased voltage is used, for example, for refreshing. Similarly, some non-volatile memory devices may require an increased voltage for erasing or reprogramming memory cells. Unfortunately, power supplies often only have a limited number of output voltages. Thus, many electronic devices include power conversion circuitry to ensure the availability of required voltages.

One commonly used voltage conversion circuitry is the voltage boosting charge pump. A voltage boosting charge pump is a device which converts an input voltage signal having a level to an output voltage signal having a higher level. Alternatively, a charge pump may accept a negative voltage to produce a more negative voltage signal. Charge pumps are well known in the art and typically include a core which accepts an oscillating clock signal and an input voltage signal. Charge pumps may include multiple cores connected in series to further boost the magnitude of the output voltage signal.

Figure 1:
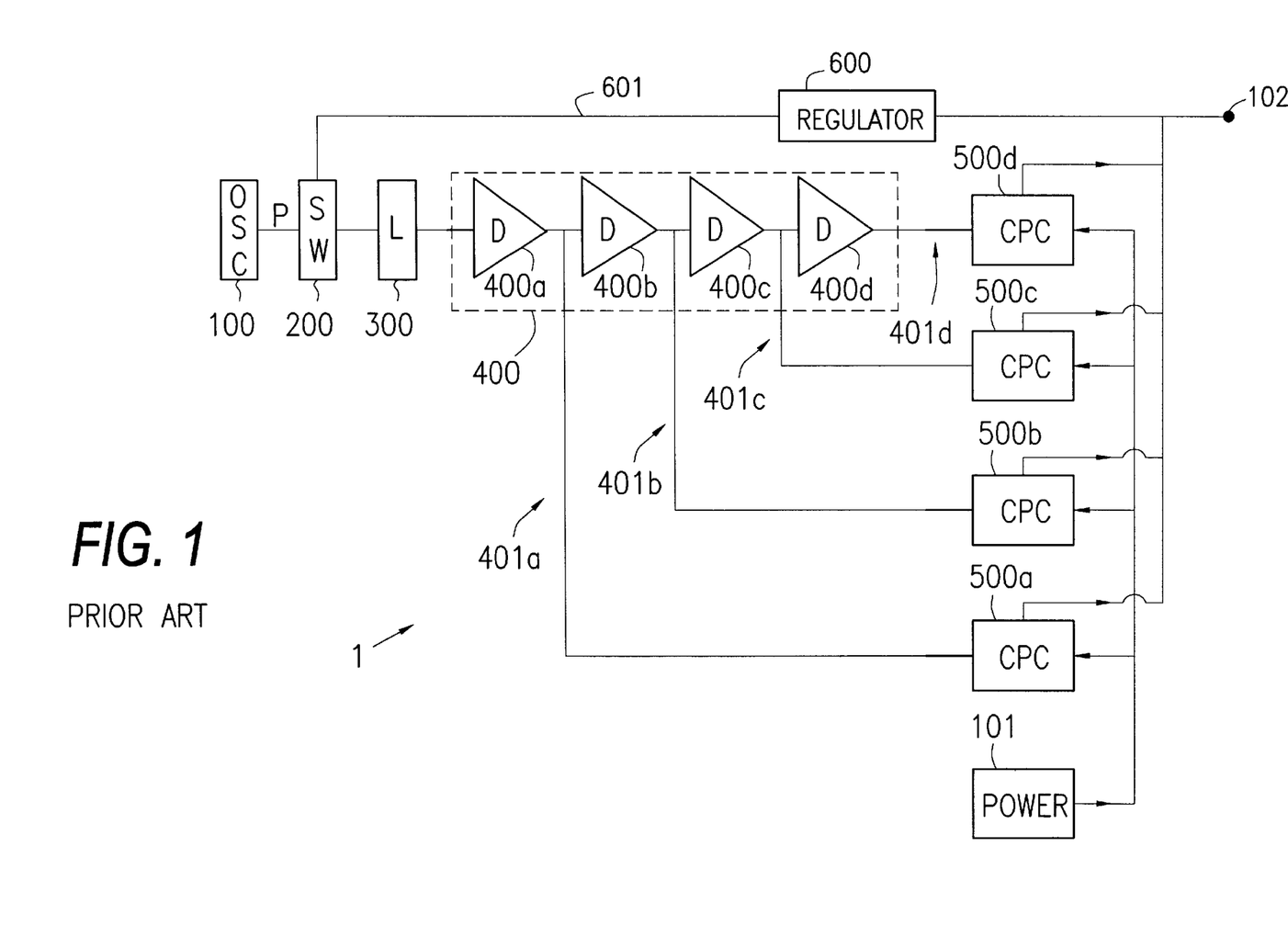
FIG. 1 is a block diagram of a prior art multi-core charge pump.

FIG. 1 is a block diagram of a typical multi-core voltage boosting charge pump 1. The charge pump 1 includes a plurality of charge pump cores 500a–500d which are coupled in series. Each charge pump core 500a–500d is coupled to a voltage source 101, and boosts that voltage to a higher value. In addition, the charge pump cores 500a–500d are connected in parallel to provide additional current output. Each charge pump core 500a–500c is also coupled to a delay chain 400 comprising a plurality of series coupled delay elements 400a–400d. The delay chain 400 is used to supply, at different times, an oscillating clock signal from an oscillator 100 to each of the charge pump cores 500a–500d via delay taps 401a–401d. The final tap 401d may be just the output of the final delay element 400d. The other taps 401a–401c are coupled in parallel to the output of the corresponding delay element 400a–400c. The oscillator 100 constantly generates the oscillating clock signal (for example, the signal P illustrated in FIG. 4A), while a regulator 600 and associated controlled switch 200 determine whether the clock signal reaches the delay chain 400 via a latch 300.

The oscillator 100 generates an oscillating clock signal P and is coupled to the switch 200. If the regulator 600 determines that the potential at output node 102 reaches a predetermined voltage, it causes the switch 200 (via signal line 601) to open, thereby preventing the oscillating clock signal from reaching the charge pump cores 500a–500d. However, if the potential at output node 102 is not the predetermined voltage, the regulator 600 causes the switch 200 (also via signal line 601) to close, thereby permitting the oscillating clock signal to reach a latch 300. The latch 300 is used to condition the clock signal as it is propagated to delay chain 400.

The delay chain 400 is comprised of a plurality of delay elements 400a–400d coupled in series. The first charge pump core 500a is coupled to a voltage source 101 and generates an output voltage signal having a greater potential. Each subsequent charge pump core 500b-500d does the same. The parallel connection of the charge pump cores produces additional current on line 102. Each charge pump core 500a–500d generates its output power signal in sequence and at different times, as governed by the delayed pulse train as it passed through differing elements of the delay chain 400. Additionally, by operating each successive charge pump core at different times, the amount of noise and power drain produced by the multiple core charge pump is reduced.

As noted, the regulator 600 is coupled to the output node 102 and measures node potential. If the potential is at least a threshold level, the regulator 600 controls the switch 200 (via signal line 601) to decouple the oscillating signal pulses to the delay chain 400, thereby preventing new pulses of the clock signal P from reaching the charge pump cores 500a–500d. However, pulses which are already within the delay chain 400 continue to get tapped at signal lines 401a–401d as they propagate through the delay chain. These pulses continue to control the charge pump cores 500a–500d, possibly causing the potential at the output node 102 to overshoot beyond a desired value even after the switch 200 has been opened.

SUMMARY OF THE INVENTION

The present invention provides a charge pump circuit and its method of operation which is designed to reduce potential overshoot at the output node when the charge pump is turned off. In one embodiment, the charge pump of the present invention has the oscillator directly coupled to the delay chain. A plurality of switches and associated latches operates in parallel so that a switch/latch pair is located between each tap from the delay chain and a corresponding charge pump core. The control lines for each switch are wired in parallel, so that a regulator may simultaneously open or close the plurality of switches. Since the switches now determine whether the charge pump cores are coupled to the delay chain, the charge pump cores may be more accurately controlled at turn off preventing the potential at the output node from overshooting.

In a modified embodiment, a plurality of transition detectors are provided in series between the taps of the delay chain and the plurality of switches to precondition the clock signals.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE INVENTION

Figure 2:
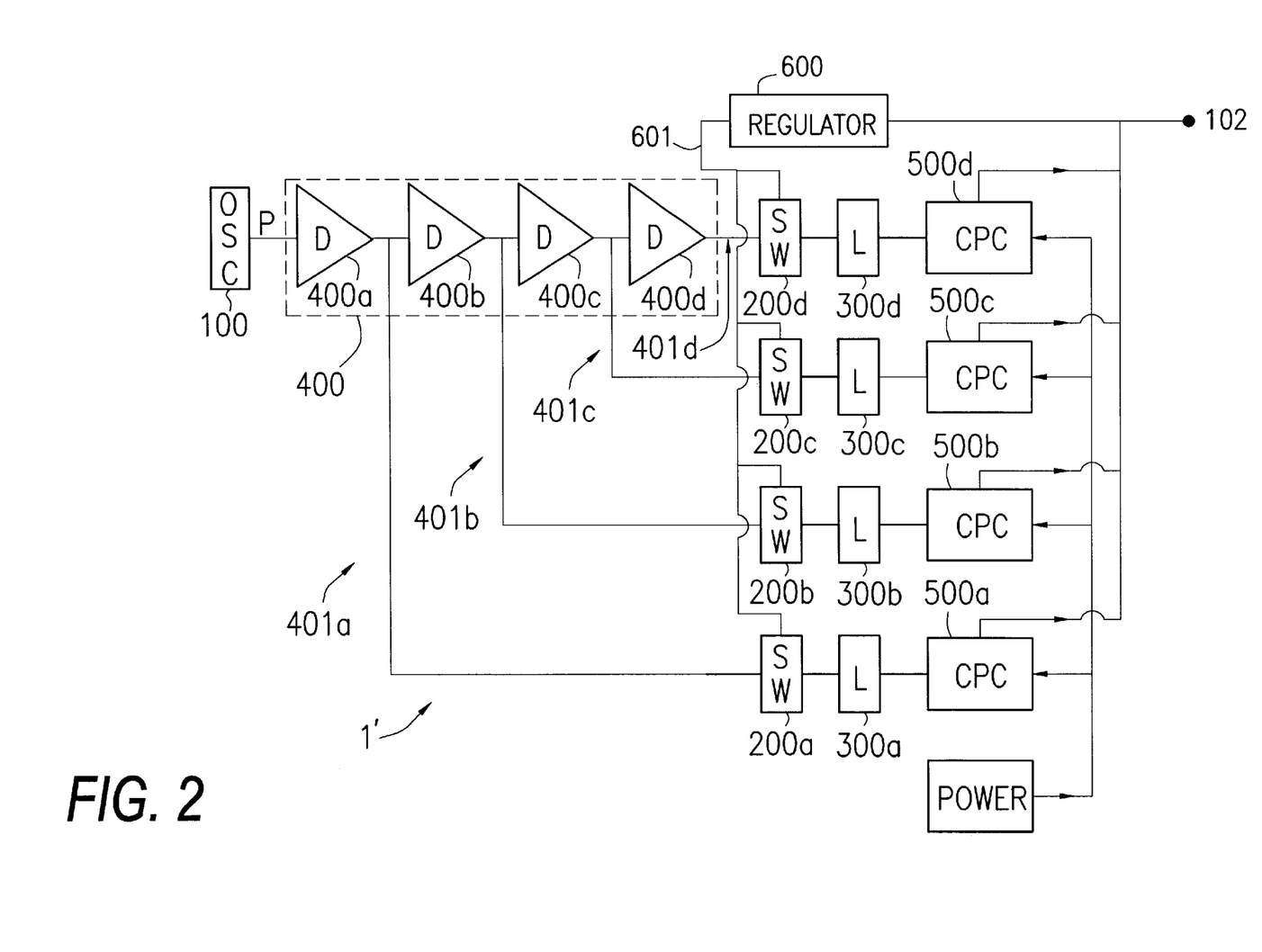
FIG. 2 is a block diagram of a multi-core charge pump in accordance with one embodiment of the present invention.

Now referring to the drawings, where like reference numerals designate like elements, there is shown in FIG. 2 a block diagram of a charge pump 1' in accordance with a first embodiment of the present invention. The charge pump 1' includes an oscillator 100 for generating a clock signal P (FIG. 4A), which is directly coupled to the delay chain 400. As illustrated, the delay chain 400 includes four delays elements 400a–400d, however, it should be understood that the number of delay elements and associated charge pump cores, described below, may be varied in order to produce the desired potential or level of boost at the output node 102.

The clock pulses generated by the oscillator 100 are supplied, after being delayed by the delay elements 400a–400d of the delay chain 400, via taps 401a–401d to respective charge pump cores 500a–500d. Although FIG. 2 shows identical number of charge pump cores 500a–500d and delay elements 400a–400d, it should be understood that the delay chain 400 may be constructed using a different number of delay elements at each stage. The taps 401a–401d do not directly couple the delay chain 400 to each charge pump core 500a–500d. Instead, each charge pump core 500a–500d is associated with its own switch 200a–200d and latch 300a–300d. Each switch 200a–200d is coupled in parallel to control line 601, thereby permitting the regulator 600 to simultaneously open or close each switch 200a–200d.

With respect to generating the boosted voltage signal at output node 102, the charge pump 1' operates in a manner similar to the prior art charge pump 1 (FIG. 1). However, when the potential at output node 102 reaches the desired predetermined voltage, the regulator 600, via signal line 601, simultaneously decouples each charge pump core 500a–500d from the delay chain 400, thereby preventing additional pules from triggering any of the charge pump cores 500a–500d. Unlike the prior art charge pump 1 (FIG. 1), pulses which are still propagating through the delay chain 400 are prevented from reaching any of the charge pump cores 500a–500d. This prevents the charge pump cores 500a–500d from further increasing the potential at the output node 102, thereby avoiding overshoot of the desired voltage at the output node 102.

Figure 3:
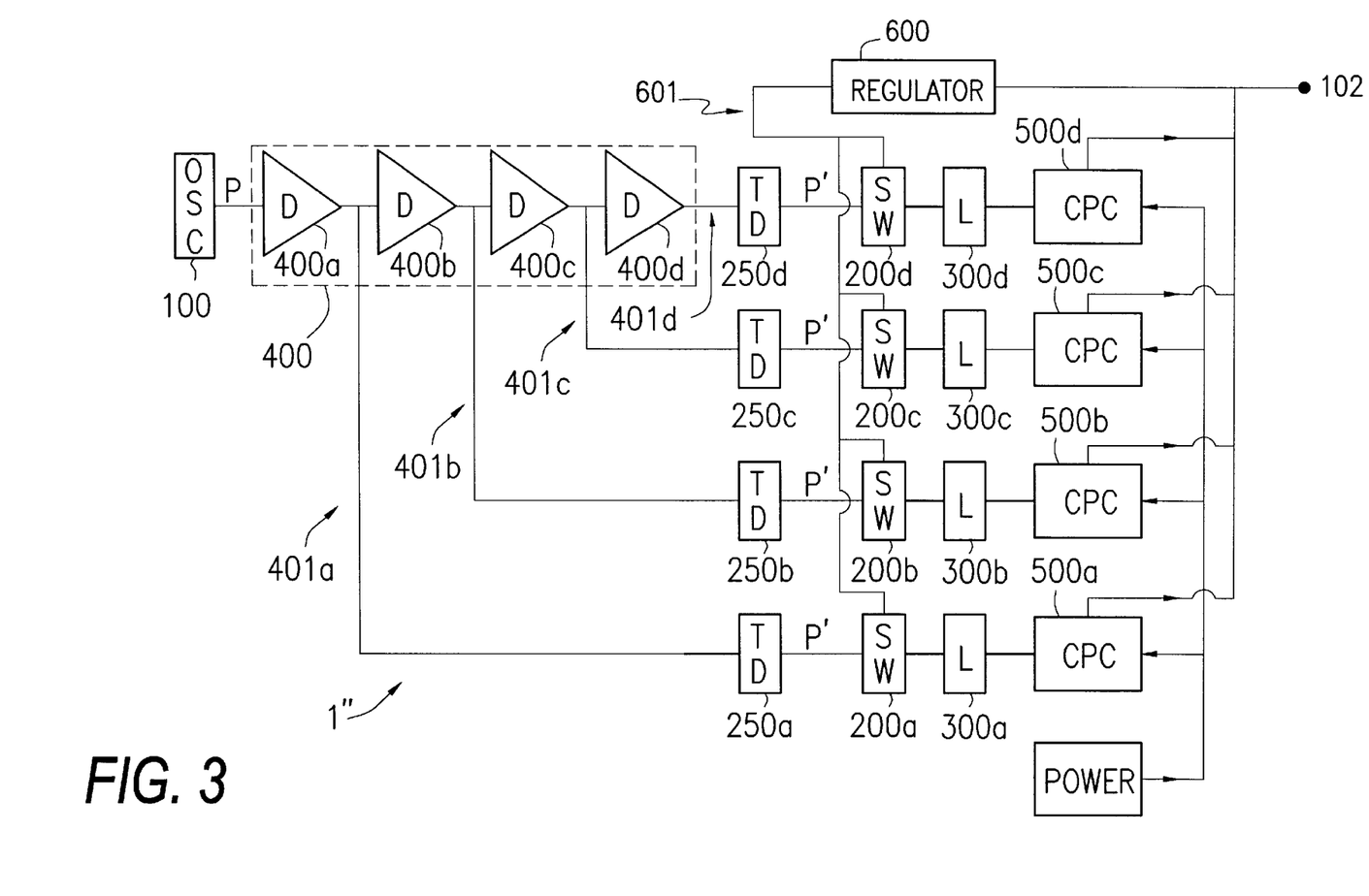
FIG. 3 is a block diagram of a multi-core charge pump in accordance with another embodiment of the present invention.

FIG. 3 is an illustration of a second embodiment of a charge pump 1" in accordance with the principles of the present invention. The second embodiment adds a plurality of transition detectors 250a–250d which are wired in series between the taps 401a–401d of the delay chain 400 and the plurality of switches 200a–200d. The plurality of transition detectors 250a–250d are used to further reduce the possibility of the charge pump overshooting the desired voltage at the output node 102. While the charge pump 1' of the first embodiment successfully prevents additional pulses from propagating into the charge pump cores 500a–500d, pulses which are propagating through the switches 200a–200d at the time the switches 200a–200d are opened may cause the charge pump cores 500a–500d to trigger and further boost the potential at the output node.

Figure 4A:
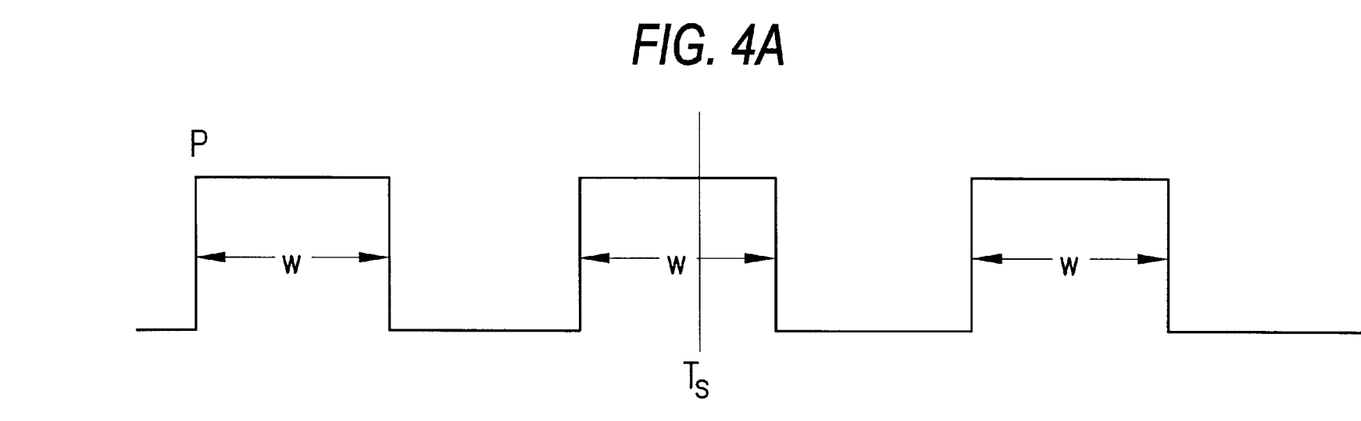
FIG. 4A is an illustration of a square wave before it is processed by a transition detector.

For example, referring now to FIG. 4A, suppose the switches 200a–200d were opened at time Ts. At time Ts, the clock pulse P is high. This high value may be latched into the latches 300a–300d and ultimately cause the charge pump cores 500a–500d to boost the potential at the output node 102 beyond the desired level.

Figure 4B:
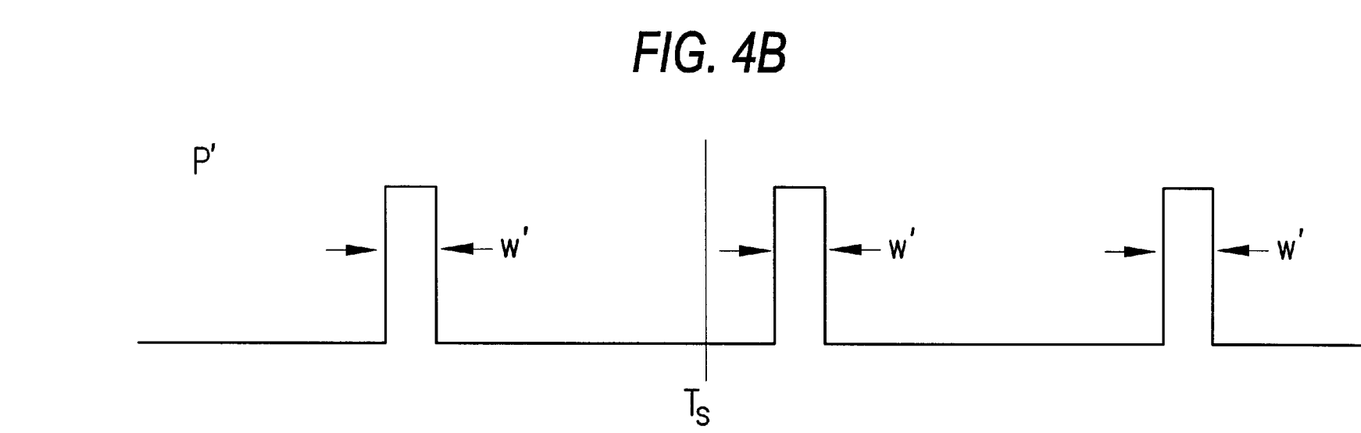
FIG. 4B is an illustration of a square wave after it has been processed by a transition detector.

FIG. 4B is an illustration of the processing of a transition detector 250a–250d. As illustrated in FIG. 4B, the transition detectors 250a–250d are triggered by each trailing edge of the pulse train to produce an output wave P' with a narrowed pulse width W', thereby reducing the probability that the pulse P' is high when the switches 200a–200d are opened at time Ts. In an alternate embodiment, the transition detectors 250a–250d may instead be triggered by each leading edge of the pulse train. As illustrated, the original wave P has a 50 percent duty cycle while the processed wave P' has a 12.5 percent duty cycle. However, it should be understood that the duty cycles of waves P and P' may be varied as long as the pulse width W' of the processed wave is less than the pulse width of the original wave W, and that both waves share the same period.

Figure 5:
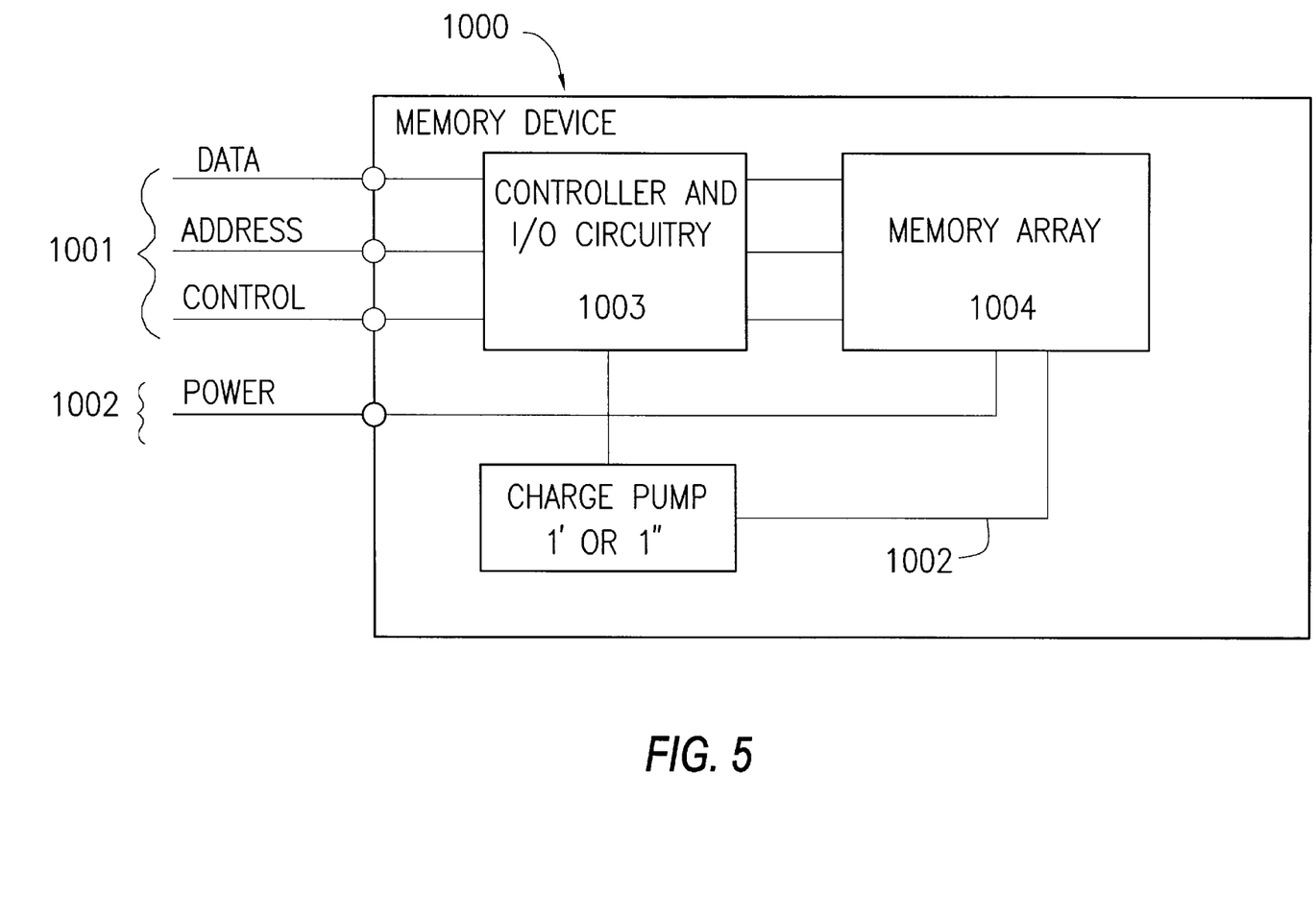
FIG. 5 is an illustration of how the charge pump may be used in a DRAM device.
Figure 6:
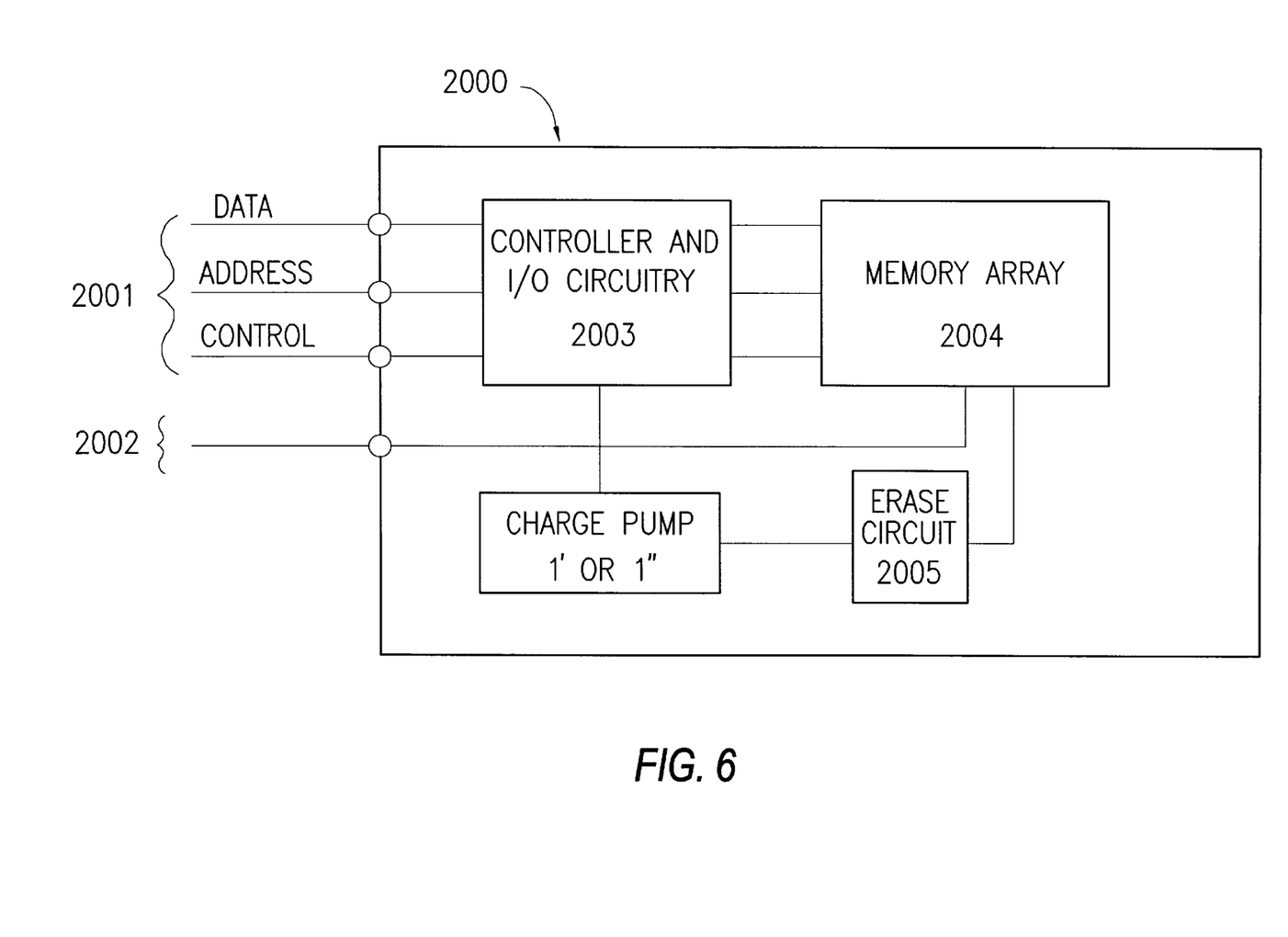
FIG. 6 is an illustration of how the charge pump may be used in a nonvolatile memory.

The charge pumps 1', 1" of the present invention may be used in any application which requires an increased voltage signal to be generated from a lower voltage input power signal (or a more negative voltage to be generated from a negative voltage, for example, $V_{BB}$). For example, FIG. 5 is an illustration of how the charge pump 1' or 1" may be used in a dynamic random access memory (DRAM) device, while FIG. 6 is an illustration of how the charge pump 1' or 1" may be used in a non-volatile memory (e.g., an EEPROM). The DRAM or non-volatile memory device 1000, 2000 includes a plurality of data, address, and control lines 1001, 2001 which are coupled to an internal controller and I/O circuitry 1003, 2003 and the memory array 1004, 2004. Power is supplied to the device 1000, 2000 on power line 1002, 2002 and routed to the controller 1003, 2003, memory array 1004, 2004, and a charge pump 1' or 1". The charge pump produces an increased voltage signal on an internal boosted power line 1002', 2002', which, in the case of the DRAM 1000 may be supplied to the memory array 1004 and used, for example, for producing a boosted word line voltage. Another charge pump application in a DRAM 100 is generating a negative substrate bias voltage. In the non-volatile memory device 2000, the boosted power may be supplied to an erase circuit 2005 to permit it to erase data in the memory array 2004.

Thus, the present invention utilizes a plurality of switches 200a–200d to simultaneously couple or decouple the plurality of charge pump cores 500a–500d from the plurality of delay elements 400a–400d of the delay chain 400. A transition detector may be optionally used to precondition the signal from the delays 400a–400d before they reach the switch. By simultaneously coupling and decoupling each charge pump core from its associated delay 400a–400d, a regulator may more accurately control the potential present at the output node 102 of the charge pump. The charge pumps 1', 1" of the present invention are suitable for a variety of applications, including use on a semiconductor device such as a DRAM or a non-volatile memory.

Figure 7:
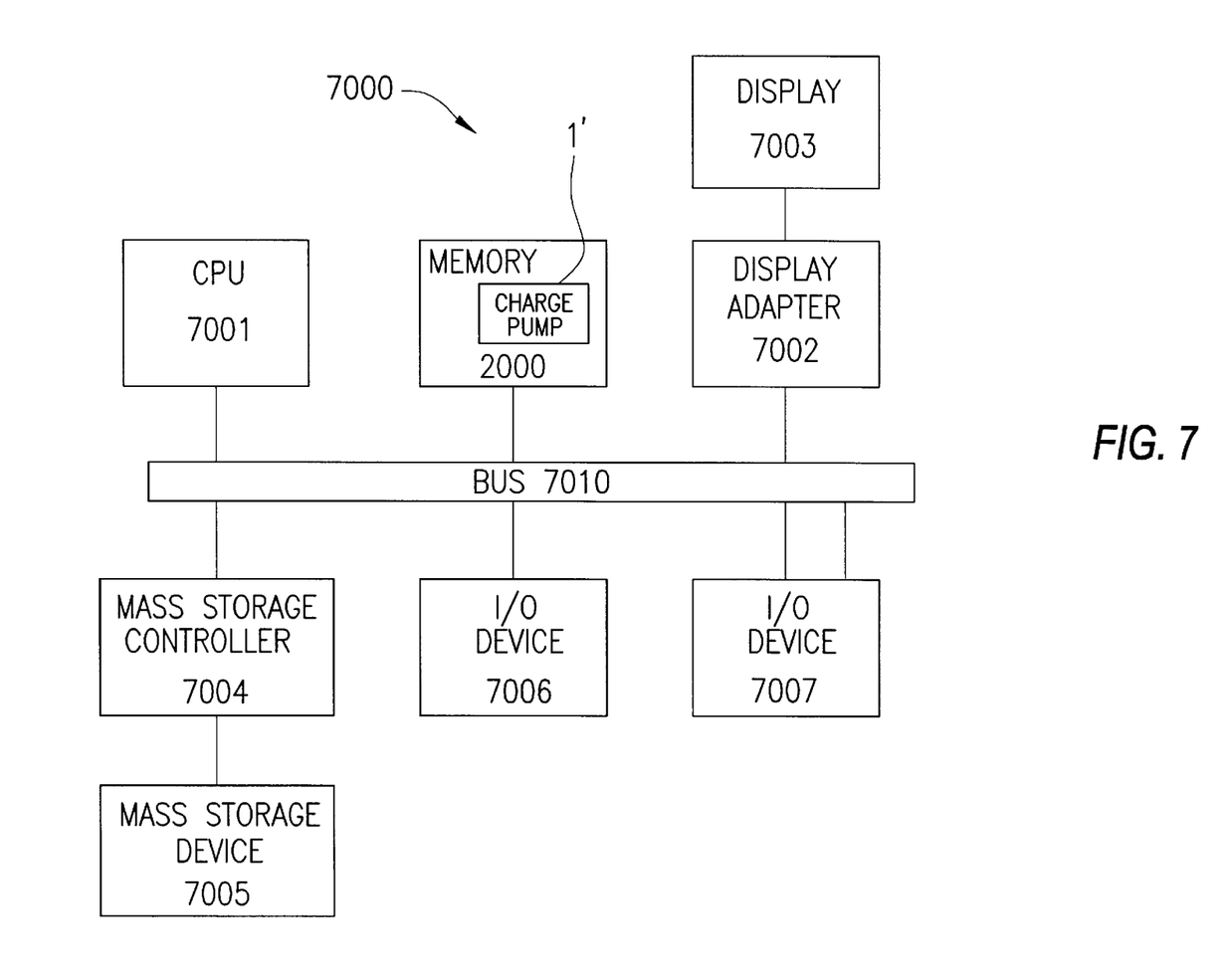
FIG. 7 is an illustration of a processing system which includes a memory device having the charge pump of the invention.

For example, FIG. 7 is an illustration of a computer system 7000 having a memory device 2000 containing a charge pump 1' in accordance with the principles of the present invention. The computer system 7000 includes a central processing unit 7001, a display adapter 7002, a mass storage controller 7004, and miscellaneous I/O devices 7006, each of which, like the memory device 2000, is coupled to a bus 7010. One or more mass storage devices 7005, for example, disk drives, may be attached to the mass storage controller 7004, while one or more displays 7003, such as a monitor, can be attached to the display adapter 7002. The miscellaneous I/O devices 7006 can be any general I/O devices, such as keyboards, mice, printers, etc. The central processing unit 7001 and memory device 2000 may also be integrated into the same chip.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A charge pump comprising:
    a plurality of charge pump cores, coupled to each other, for outputting a voltage signal having a boosted magnitude potential to an output node;
    a plurality of switches, said plurality of switches receiving respectively delayed clock signals from an oscillator; and
    a regulator for measuring the potential at the output node, said regulator controllably coupled to each of said plurality of switches and causing said each of said plurality of switches to open at the same time when the voltage at the output node has a magnitude which meets or exceeds a predetermined value.

2. The charge pump of claim 1, wherein the regulator causes each of said plurality of switches to close at the same time when the potential at the output node has a magnitude which is below the predetermined value.

3. The charge pump of claim 1, further comprising:
    a plurality of latches, wherein the output of each of said plurality of switches is coupled a different one of the plurality of latches.

4. The charge pump of claim 3, wherein each of said plurality of latches is coupled a different one of said plurality of charge pump cores.

5. The charge pump of claim 1, further comprising:
    a first plurality of delay elements, coupled to each other in series to form a delay chain and a second plurality of delay elements having a tap for supplying the delayed clock signals to said plurality of switches.

6. The charge pump of claim 1, further comprising:
    a plurality of transition detectors, each of said plurality of transition detectors coupled to a different one of said plurality of switches, wherein each of said plurality of transition detectors reduces the pulse width of said delayed clock signals before said delayed clock signals are received by said plurality of switches.

7. The charge pump of claim 6, wherein said plurality of transition detectors are triggered by the trailing edges of the said delayed clock signals.

8. The charge pump of claim 6, wherein each of said plurality of transition detectors are triggered by the leading edges of said delayed clock signals.

9. A memory device comprising:
    a memory array; and
    a charge pump coupled to said memory array, said charge pump further comprising:
        a plurality of charge pump cores, coupled to each other, for outputting a voltage signal having a boosted magnitude potential to an output node;
        a plurality of switches, said plurality of switches receiving respectively delayed clock signals from an oscillator; and
        a regulator for measuring the potential at the output node, said regulator controllably coupled to each of said plurality of switches and causing said each of said plurality of switches to open at the same time when the voltage at the output node has a magnitude which meets or exceeds a predetermined value.

10. The memory device of claim 9, wherein the regulator causes each of said plurality of switches to close at the same time when the potential at the output node has a magnitude which is below the predetermined value.

11. The memory device of claim 9, further comprising:
    a plurality of latches, wherein the output of each of said plurality of switches is coupled a different one of the plurality of latches.

12. The memory device of claim 11, wherein each of said plurality of latches is coupled a different one of said plurality of charge pump cores.

13. The memory device of claim 9, further comprising:
    a first plurality of delay elements, coupled to each other in series to form a delay chain and a second plurality of delay elements having a tap for supplying the delayed clock signals to said plurality of switches.

14. The memory device of claim 9, further comprising:
    a plurality of transition detectors, each of said plurality of transition detectors coupled to a different one of said plurality of switches, wherein each of said plurality of transition detectors reduces the pulse width of said delayed clock signals before said delayed clock signals are received by said plurality of switches.

15. The memory device of claim 14, wherein said plurality of transition detectors are triggered by the trailing edges of the said delayed clock signals.

16. The memory device of claim 14, wherein each of said plurality of transition detectors are triggered by the leading edges of said delayed clock signals.

17. A processor system comprising:
    a processor;
    a memory coupled to said processor, said memory including a charge pump, said charge pump further comprising:
        a plurality of charge pump cores, coupled to each other, for outputting a voltage signal having a boosted magnitude potential to an output node;
        a plurality of switches, said plurality of switches receiving respectively delayed clock signals from an oscillator; and
        a regulator for measuring the potential at the output node, said regulator controllably coupled to each of said plurality of switches and causing said each of said plurality of switches to open at the same time when the voltage at the output node has a magnitude which meets or exceeds a predetermined value.

18. The processor system of claim 17, wherein the regulator causes each of said plurality of switches to close at the same time when the potential at the output node has a magnitude which is below the predetermined value.

19. The processor system of claim 17, further comprising:
    a plurality of latches, wherein the output of each of said plurality of switches is coupled a different one of the plurality of latches.

20. The processor system of claim 19, wherein each of said plurality of latches is coupled a different one of said plurality of charge pump cores.

21. The processor system of claim 17, further comprising:
    a first plurality of delay elements, coupled to each other in series to form a delay chain and a second plurality of delay elements having a tap for supplying the delayed clock signals to said plurality of switches.

22. The processor system of claim 17, further comprising:

a plurality of transition detectors, each of said plurality of transition detectors coupled to a different one of said plurality of switches, wherein each of said plurality of transition detectors reduces the pulse width of said delayed clock signals before said delayed clock signals are received by said plurality of switches.

23. The processor system of claim 22, wherein said plurality of transition detectors are triggered by the trailing edges of the said delayed clock signals.

24. The processor system of claim 22, wherein each of said plurality of transition detectors are triggered by the leading edges of said delayed clock signals.

25. The processor system of claim 17, wherein said processor and said memory are integrated on a single semiconductor chip.

26. A method for operating a charge pump comprising the steps of:

supplying a plurality of delayed clock signals to respective cores of a charge pump via a plurality of switches; and changing the state of each of said plurality of switches at the same time.

27. The method of claim 26, wherein said changing the state further comprising the steps of:

monitoring a voltage of an output signal of the charge pump; and closing said plurality of switches at the same time when a magnitude of said voltage is below a predetermined value.

28. The method of claim 26, wherein said changing the state further comprises the steps of:

monitoring a voltage of an output of the charge pump; and opening said plurality of switches at the same time when a magnitude of said voltage is equal to or above a predetermined value.

29. The method of claim 26, further comprising the step of:

reducing the pulse width of said plurality of delayed clock signals before the delayed clock signals arrive at the respective switches.

30. The method of claim 29, wherein said reducing is triggered at each trailing edge of a delayed clock signal.

31. The method of claim 30, wherein said reducing is triggered at each leading edge of a delayed clock signal.

* * * * *

UNITED STATES PATENT AND TRADEMARK OFFICE
CERTIFICATE OF CORRECTION

PATENT NO.   : 6,490,220 B1
DATED        : December 3, 2002
INVENTOR(S)  : Todd A. Merritt et al.

It is certified that error appears in the above-identified patent and that said Letters Patent is hereby corrected as shown below:

Column 3,
Line 43, reads "pules", should read -- pulses --.

Signed and Sealed this

Eighteenth Day of March, 2003

JAMES E. ROGAN
*Director of the United States Patent and Trademark Office*